(12) United States Patent
Liu et al.

(10) Patent No.: US 10,790,289 B2
(45) Date of Patent: Sep. 29, 2020

(54) METHOD OF FORMING A STOP LAYER FILLING IN A SPACE BETWEEN SPACERS

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chih-Chien Liu, Taipei (TW); Tzu-Chin Wu, Chiayi County (TW); Po-Chun Chen, Tainan (TW); Chia-Lung Chang, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 16/583,272

(22) Filed: Sep. 26, 2019

(65) Prior Publication Data
US 2020/0020693 A1    Jan. 16, 2020

Related U.S. Application Data

(62) Division of application No. 15/959,291, filed on Apr. 23, 2018, now Pat. No. 10,468,417.

(30) Foreign Application Priority Data

Mar. 14, 2018   (CN) .......................... 2018 1 0208251

(51) Int. Cl.
*H01L 21/00*    (2006.01)
*H01L 27/108*   (2006.01)
*H01L 21/02*    (2006.01)
*H01L 21/8234*  (2006.01)

(52) U.S. Cl.
CPC .. *H01L 27/10829* (2013.01); *H01L 21/02329* (2013.01); *H01L 21/823475* (2013.01); *H01L 27/10861* (2013.01)

(58) Field of Classification Search
USPC .......................................... 257/773
See application file for complete search history.

(56) References Cited

U.S. PATENT DOCUMENTS

| | | | |
|---|---|---|---|
| 8,703,573 B2* | 4/2014 | Oh | H01L 27/1021 257/E21.351 |
| 8,829,483 B2* | 9/2014 | Ren | H01L 45/1253 257/4 |
| 9,076,963 B2* | 7/2015 | Van Gerpen | H01L 45/06 |
| 9,112,150 B2* | 8/2015 | Redaelli | H01L 45/126 |
| 9,153,499 B2 | 10/2015 | Kim | |
| 9,224,744 B1* | 12/2015 | Yokota | H01L 21/0338 |
| 9,252,188 B2* | 2/2016 | Tang | H01L 27/2463 |
| 9,401,322 B2* | 7/2016 | Naujok | H01L 21/7682 |
| 9,514,905 B2* | 12/2016 | Redaelli | H01H 85/11 |

(Continued)

*Primary Examiner* — Caleb E Henry
(74) *Attorney, Agent, or Firm* — Winston Hsu

(57) ABSTRACT

A fabricating method of a stop layer includes providing a substrate. The substrate is divided into a memory region and a peripheral circuit region. Two conductive lines are disposed within the peripheral circuit region. Then, an atomic layer deposition is performed to form a silicon nitride layer to cover the conductive lines. Later, after forming the silicon nitride layer, a silicon carbon nitride layer is formed to cover the silicon nitride layer. The silicon carbon nitride layer serves as a stop layer.

8 Claims, 7 Drawing Sheets

(56) References Cited

U.S. PATENT DOCUMENTS

| | | | |
|---|---|---|---|
| 9,881,971 B2* | 1/2018 | Lindenberg | H01L 27/2463 |
| 9,991,316 B2* | 6/2018 | Zuliani | H01L 45/06 |
| 10,468,594 B2* | 11/2019 | Lee | H01L 45/06 |
| 2005/0253268 A1* | 11/2005 | Hsu | H01L 23/5222 |
| | | | 257/758 |
| 2014/0134842 A1* | 5/2014 | Zhang | H01J 37/32357 |
| | | | 438/694 |
| 2014/0273524 A1 | 9/2014 | Nguyen | |
| 2016/0035730 A1 | 2/2016 | Sukekawa | |
| 2018/0350875 A1* | 12/2018 | Han | H01L 23/53295 |

* cited by examiner

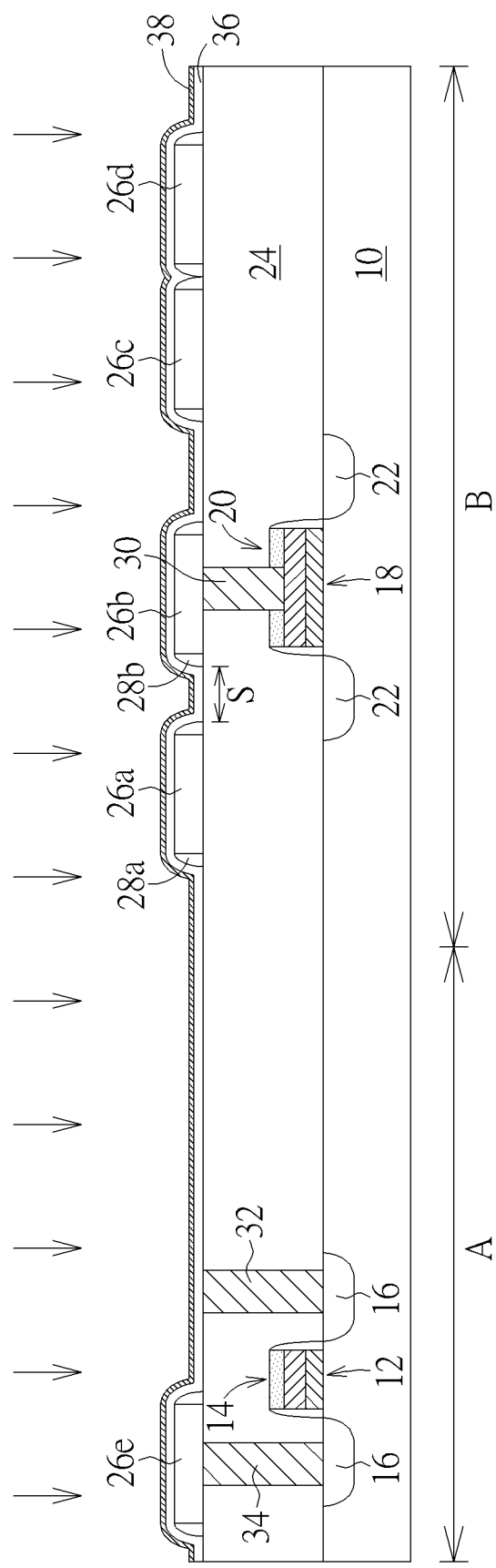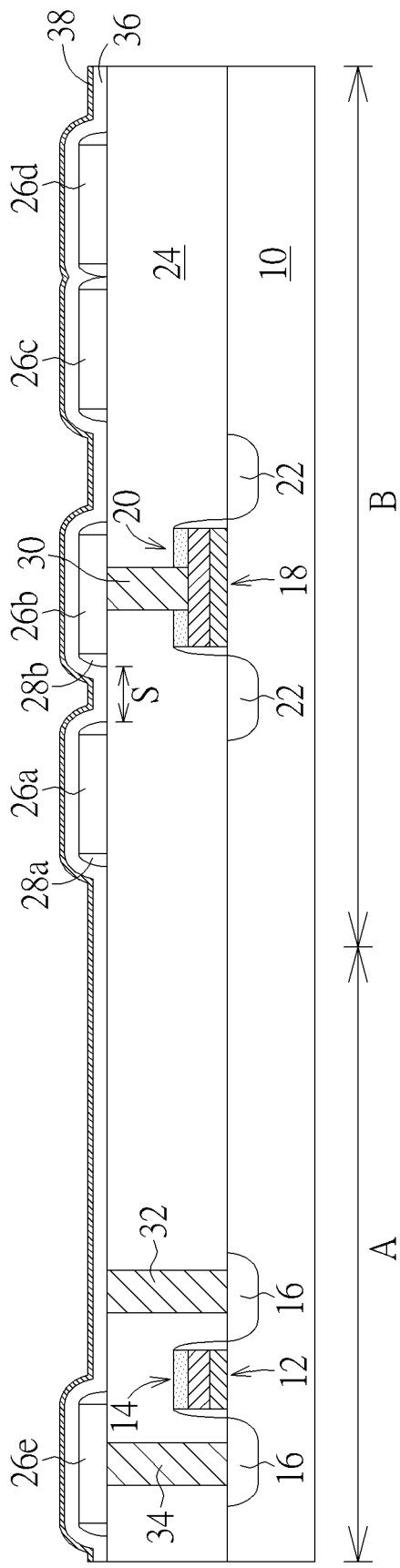
FIG. 3
FIG. 4

US 10,790,289 B2

METHOD OF FORMING A STOP LAYER FILLING IN A SPACE BETWEEN SPACERS

CROSS REFERENCE TO RELATED APPLICATIONS

This patent application is a divisional application of and claims priority to U.S. patent application Ser. No. 15/959,291, filed on Apr. 23, 2018, and entitled "SEMICONDUCTOR STRUCTURE WITH A CONDUCTIVE LINE AND FABRICATING METHOD OF A STOP LAYER" the entire contents of which are incorporated herein by reference.

BACKGROUND OF THE INVENTION

1. Field of the Invention

The present invention relates to a method of forming a stop layer. More particularly, the present invention relates to a method of forming a silicon carbon nitride layer that is used as a stop layer.

2. Description of the Prior Art

Dynamic random access memory (DRAM) is a major type of volatile memory that has been widely used in many electronics. A conventional DRAM usually includes an array region for data storage formed by an enormous number of memory cells. Typically, a memory cell is formed by serially connecting a capacitor to a transistor.

Capacitors are disposed in a memory region of a DRAM. Other transistors and contact structures are formed in a peripheral region adjacent to the memory region. During the process of forming the capacitors, a dielectric layer is firstly formed in the memory region and the peripheral region. Openings respectively corresponding to one of the capacitors are then formed in the dielectric layer. After forming the capacitor bottom electrodes along the sidewall and bottom surfaces of the openings, the dielectric layer is removed. However, the etching stop layer for protecting the underlying structures from being etched during removing the dielectric layer may have poor step coverage in the peripheral region. Consequently, the devices in the peripheral region may be exposed to the risk of being damaged during removing the dielectric layer.

SUMMARY OF THE INVENTION

In light of the above, one objective of the present invention is to provide a method of forming a stop layer having an improved step coverage to ensure integrity of the underlying structures.

According to a preferred embodiment of the present invention, a semiconductor structure including conductive lines is provided. The semiconductor structure including conductive lines includes a substrate that is divided into a memory region and a peripheral region, a first conductive line disposed in the peripheral region, a silicon nitride layer covering the first conductive line, and a silicon carbon nitride layer covering and in direct contact with the silicon nitride layer.

According to another preferred embodiment of the present invention, a method of forming a stop layer is disclosed, including the following steps. First, a substrate is provided. The substrate is divided into a memory region and a peripheral region and two conductive lines are disposed in the peripheral region of the substrate. Subsequently, an atomic layer deposition process is performed to form a silicon nitride layer covering the conductive lines. After forming the silicon nitride layer, a silicon carbon nitride layer covering the silicon nitride layer is formed to serve as a stop layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 illustrate a method of forming a semiconductor structure including conductive lines according to one embodiment of the present invention, wherein:

FIG. 1 depicts a substrate with a memory region and a peripheral region;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
FIG. 8 is a fabricating stage following FIG. 7; and
FIG. 9 is a fabricating stage following FIG. 8.

DETAILED DESCRIPTION

Figure 1:
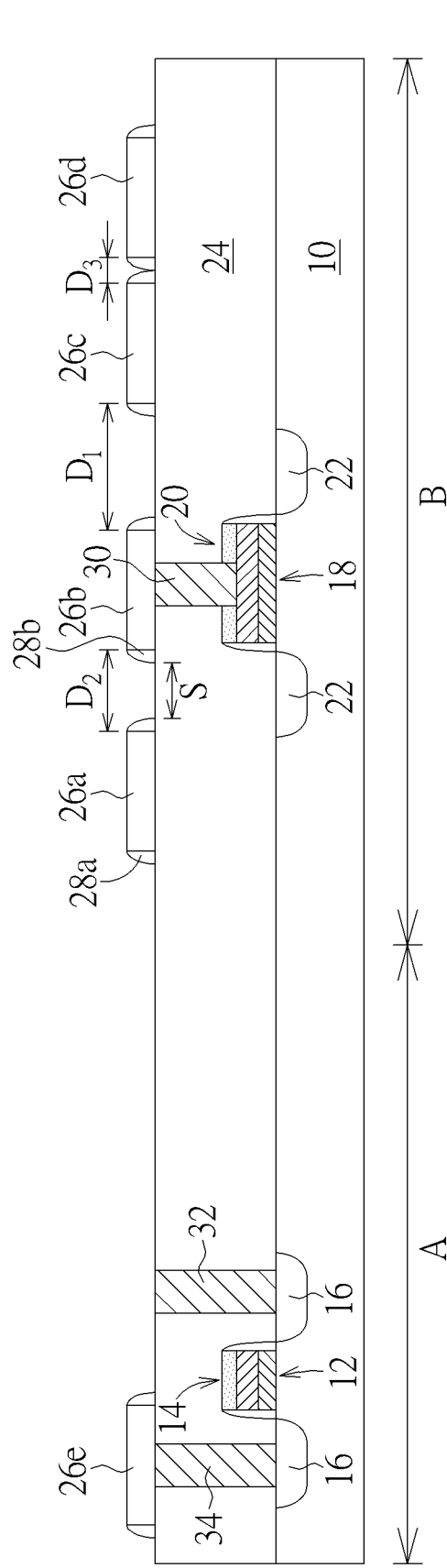

Please refer to FIG. 1 to FIG. 9, which illustrate a method of forming a semiconductor structure including conductive lines according to one preferred embodiment of the present invention. As shown in FIG. 1, a substrate 10 is provided. The substrate 10 may be divided into a memory region A and a peripheral region B. A first transistor 12 is disposed on the substrate 10 of the memory region A. The first transistor 12 includes a first gate 14 and two source/drain regions 16 respectively disposed at two sides of the first gate 14. A second transistor 18 is disposed on the substrate 10 of the peripheral region B. The second transistor 18 includes a second gate 20 and two source/drain regions 22 respectively disposed at two sides of the second electrode 20. Subsequently, a dielectric layer 24 is formed covering the memory region A and the peripheral region B of the substrate 10. A first conductive line 26a, a second conductive line 26b, a third conductive line 26c and a fourth conductive line 26d are then formed on the dielectric layer 24 of the peripheral region B, and a fifth conductive line 26e is formed on the dielectric layer 24 of the memory region A. The dielectric layer 24 may include dielectric materials such as silicon oxide, silicon nitride or silicon oxynitride. The number of the conductive lines in the peripheral region B and the memory region A may be adjusted according to design needs. In the illustrated embodiment, four conductive lines formed in the peripheral region B and one conductive line formed in the memory region A is only for illustration purposes and should not be taken as a limitation. The spaces between adjacent conductive lines may be the same or different. For example, among the space D1 between the second conductive line 26b and the third conductive line 26c, the space D2 between the first conductive line 26a and the second conductive line 26b, and the space D3 between the third conductive line 26c and the fourth conductive line 26d, the space D1 may be the largest, the second space D2 may be the second, and the space D3 may be the smallest. Subsequently, spacers are formed on two sides of each conductive line. For example, two first spacers 28a are formed respectively on two sides of the first conductive line 26a, and two second spacers 28b are formed respectively on two sides of the second conductive line 26b. Similarly, as shown in FIG. 1, two spacers are formed respectively on two sides of the third conductive line 26c, the fourth conductive line 26d and the fifth conductive line 26e. As previously mentioned, the space D3 between the third conductive line 26c and the fourth conductive line 26d may the smallest, so that the two spacers respectively on a sidewall of the third conductive line 26c and a sidewall of the fourth conductive line 26d facing the third conductive line 26c may be jointed. Accordingly, the dielectric layer 24 exposed from the space between the second conductive line 26c and the fourth conductive line 26d may be completely covered by the spacer on the sidewall of the third conductive line 26c and the spacer on the sidewall of the fourth conductive line 26d facing the third conductive line 26c. In the illustrated embodiment, one of the first spacers 28a and one of the second spacers 28b are adjacent to each other and spaced apart from each other by a space S smaller than 330 nm. It is noteworthy that the method provided by the present invention is especially applicable for the situation when the space S is between 230 nm and 330 nm. The reason is that when the space S is between 230 nm and 330 nm, the stop layer formed by a conventional method may not be able to completely fill up or entirely cover the space S. Regarding a space between adjacent spacers smaller than the space S, such as the space between the adjacent spacers respectively on the third conductive line 26c and the fourth conductive line 26d, as previously mentioned, the spacers on the third conductive line 26c and the fourth conductive line 26d may be jointed together, and therefore the dielectric layer 24 between the third conductive line 26c and the fourth conductive line 26d would be completely covered. Therefore, there is no need for the stop layer to fill into the space. Regarding when a space between adjacent spacers is larger than the space S, such as the space between the adjacent spacers respectively on the second conductive line 26b and the third conductive line 26c, the space is large enough for the stop layer easily to fill into the space without difficulties caused by the space. Therefore, the method provided by the present invention may be selectively applied. However, regarding the space S ranges from 230 nm and 330 nm, it is too large for spacers to be jointed thereby completely covering the dielectric layer 24, and nevertheless, it is also too small for the stop layer to fill into the space S without any difficulties. Therefore, it is preferred to perform the method provided by the present invention when the space S is between 230 nm and 330 nm.

Furthermore, the first conductive line 26a, the second conductive line 26b, the third conductive line 26c, the fourth conducive line 26d and the fifth conductive line 26e are parallel with each other. Furthermore, after the dielectric layer 24 has been formed, a conductive plug 30 may be formed in the dielectric layer 24 directly over the second transistor 18, and a conductive plug 32 and a conductive plug 34 are respectively formed in the dielectric layer 24 directly over the source/drain regions 16. The second conductive line 26b is in direct contact and electrically connected to the conductive plug 30. The fifth conductive line 26e is in direct contact and electrically connected to the conductive plug 34. The contact plug 32 may have an elongated shape that extends along a direction parallel with the extending direction of the first gate 14. An extending portion of the conductive plug 32 may be electrically connected to a bit line (not shown). The first conductive line 26a, the second conductive line 26b, the third conductive line 26c, the fourth conducive line 26d and the fifth conductive line 26e may include conductive materials such as tungsten, copper or aluminum. In the illustrated embodiment, the first transistor 12 is formed in the dielectric layer 24. However, in various embodiments, when the first transistor 12 is formed buried in the substrate 10, it may be formed having a structure which is integrated with a buried word line.

Figure 2:
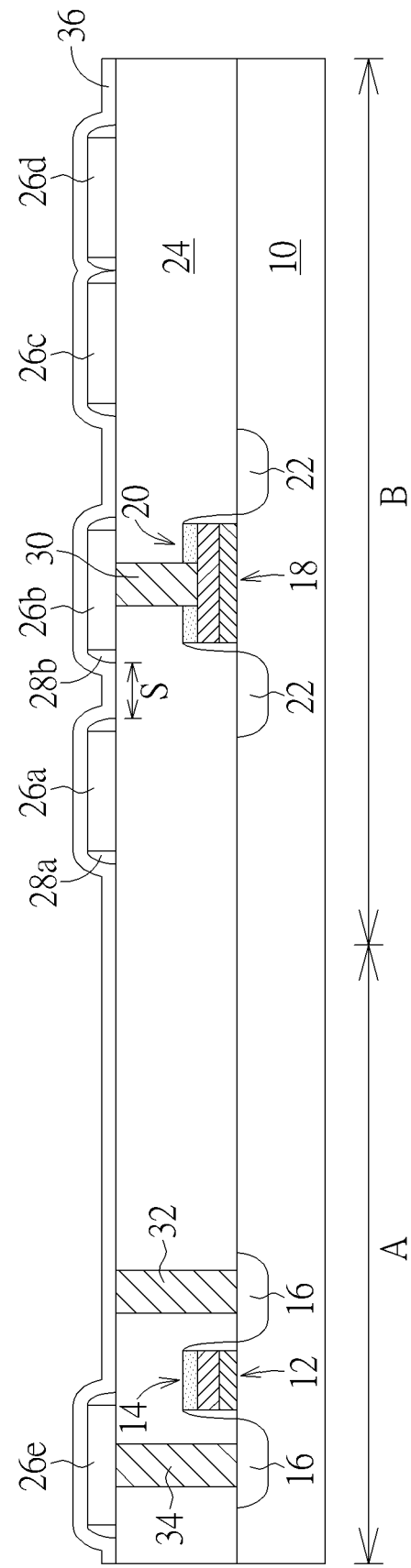

Please refer to FIG. 2. Subsequently, an atomic layer deposition (ALD) process is performed to form a silicon nitride layer 36 conformally covering the first conductive line 26a, the second conductive line 26b, the third conductive line 26c, the fourth conducive line 26d and the fifth conductive line 26e. The process temperature of forming the silicon nitride layer 36 may be approximately 500° C. The reason for forming the silicon nitride layer 36 preferably by the ALD process is illustrated in the following passages. A conventional silicon nitride layer 36 formed by plasma enhanced vapor deposition (PECVD) may have poor step coverage and is not able to fill into a small space such as the space S between the first spacer 28a and the second spacer 28b. Consequently, a portion of the dielectric layer 24 exposed from the space S may not be fully covered by the silicon nitride layer 36. On the other hand, a silicon nitride layer 36 formed by ALD process may have a better step coverage and is able to fill into all the spaces between the first conductive line 26a, the second conductive line 26b, the third conductive line 26c and the fourth conducive line 26d, and therefore the dielectric layer 24 exposed from the spaces may be fully covered. In the illustrated embodiment when the space S is from 230 nm to 330 nm, the thickness of the silicon nitride layer 36 may range from 130 nm to 170 nm, and preferably 130 nm, to allow a conformal and complete coverage of the silicon nitride layer 36 along the conductive lines and to prevent any seam or void being enclosed by the silicon nitride layer 36 in the space S.

Please refer to FIG. 3. Afterward, a silicon carbon nitride layer 38 is formed covering the silicon nitride layer 36. The silicon carbon nitride layer 38 may be formed by performing a carbon plasma treatment to the silicon nitride layer 36 to transform a portion of the silicon nitride layer 36 into the silicon carbon nitride layer 38. The process temperature of the carbon plasma treatment has to be below 550° C. Furthermore, precursors including carbon such as trimethylsilane, tetramethylsilane, methane or ethane may be used to generate the carbon plasma. However, precursors including oxygen are not applicable in the present invention. The silicon carbon nitride layer 38 may serve as a stop layer in a later process. To this point, the space S between the first spacer 28a and the second spacer 28b is filled by the silicon carbon nitride 38 and the silicon nitride layer 36. The silicon carbon nitride layer 38 may serve as a stop layer during a subsequent wet etching process using 49% hydrofluoric acid (HF) to remove a dielectric layer for forming a crown capacitor. The thickness of the silicon carbon nitride layer 38 is preferably larger than 40 nm to ensure the dielectric layer 24 would not be etched by the acid etchant. According to an embodiment, the thickness of the silicon nitride layer 36 may range from 130 nm to 170 nm, and the thickness of the silicon carbon nitride layer 38 may range from 40 nm to 80 nm. The ratio of the thickness of the silicon carbon nitride layer 38 to the thickness of the silicon nitride layer 36 may be 1.6 to 4.2.

Please refer to FIG. 4. According to another preferred embodiment, the silicon carbon nitride layer 38 may be formed by a deposition process, such as a chemical vapor deposition (CVD) process or a physical vapor deposition (PVD) process. Similarly, the ratio of the thickness of the silicon carbon nitride layer 38 to the thickness of the silicon nitride layer 36 is preferably 1.6 to 4.2.

Figure 5:
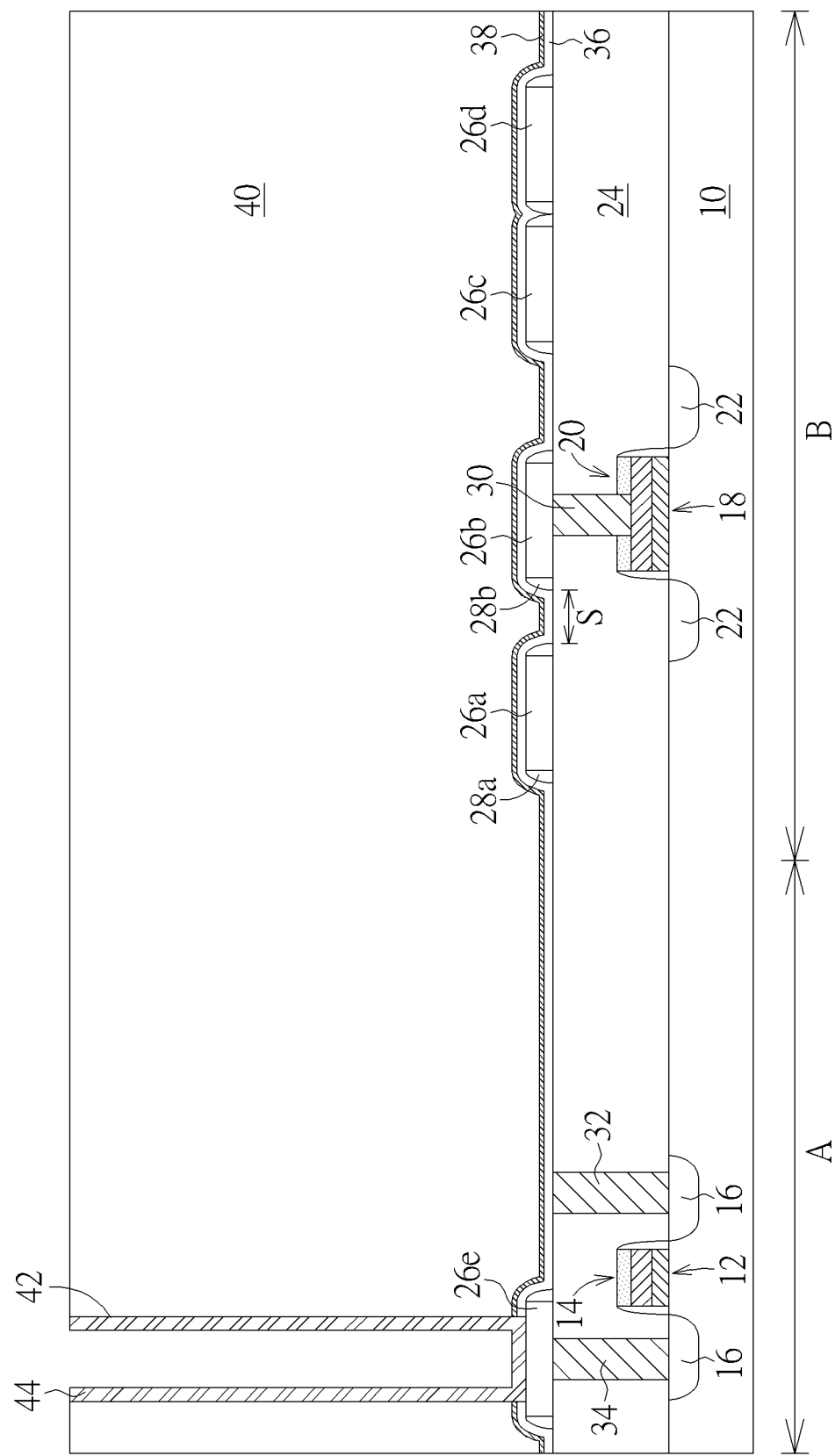

Please refer to FIG. 5. Subsequently, a dielectric layer 40 is formed on the substrate 10. The material of the dielectric layer 40 may include insulating materials such as silicon nitride, silicon oxide, silicon oxynitride or borophosphosilicate glass (BPSG). An opening 42 is then formed in the dielectric layer 40 in the memory region A and the fifth conductive line 26e is exposed from the opening 42. A capacitor bottom electrode 44 is then formed in the opening 42 and conformally covering the dielectric layer 40 and the sidewall and bottom of the opening 42. A portion of the capacitor bottom electrode 44 at the bottom of the opening 42 is in direct contact with the fifth conductive line 26e. After that, the capacitor bottom electrode 44 outside the opening 42 is removed.

Figure 6:
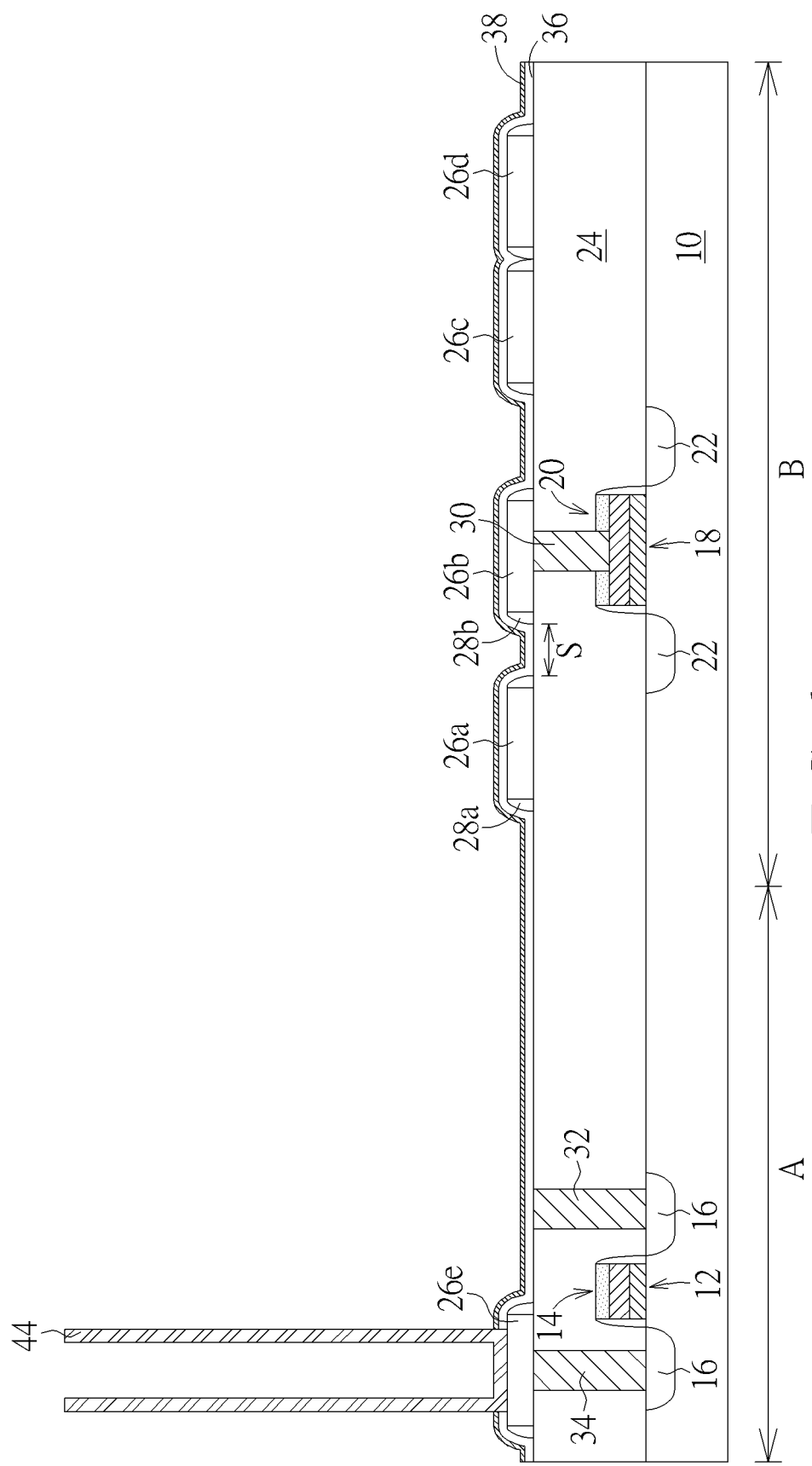

Please refer to FIG. 6. An etching process is performed to completely remove the dielectric layer 40. The etching process is preferably a wet etching process. It is noteworthy that the silicon carbon nitride layer 38 serves as a stop layer in the wet etching process. That is, the silicon carbon nitride layer 38 would not be etched by the etchant used in the wet etching process. Therefore, the dielectric layer 24 under the silicon carbon nitride layer 38 is protected from being etched.

Figure 7:
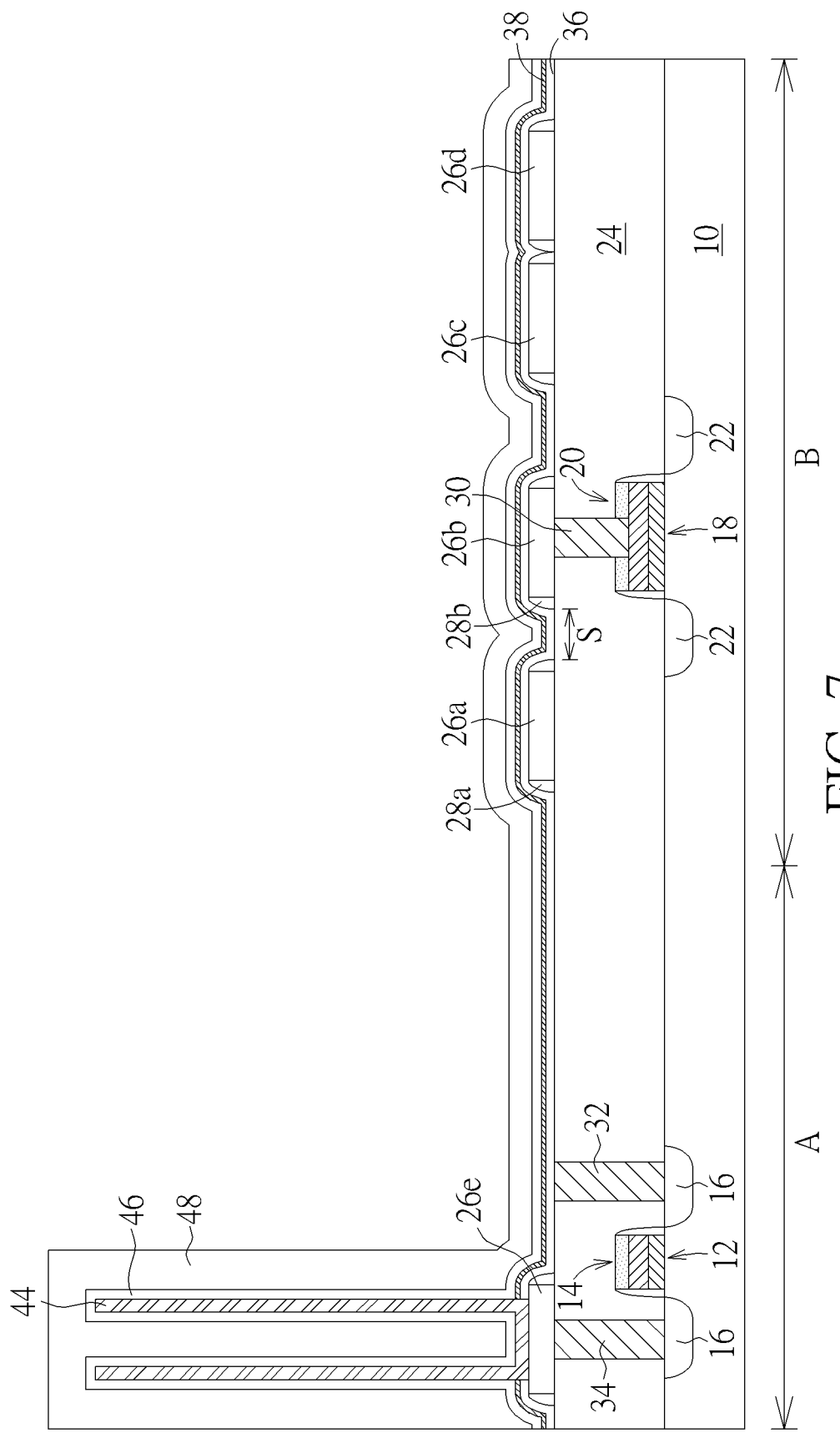
Figure 8:
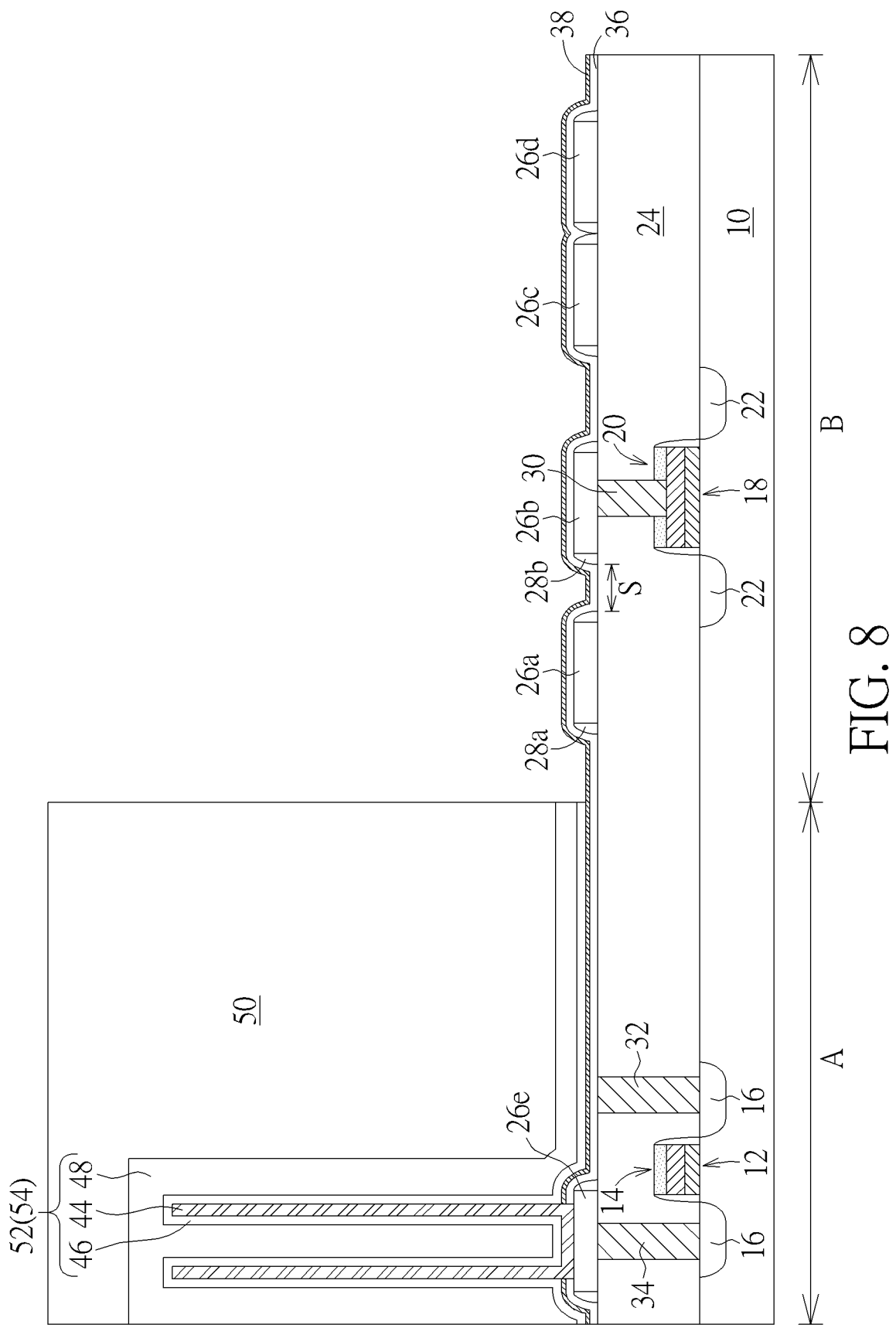

Please refer to FIG. 7. After removing the dielectric layer 40, a capacitor dielectric layer 46 and a capacitor top electrode 48 are successively formed covering the capacitor bottom electrode 44. The material of the capacitor top electrode 48 and the capacitor bottom electrode 44 may include conductive materials such as platinum, tungsten, tungsten nitride, titanium nitride or tantalum nitride. Furthermore, the capacitor top electrode 48 may include multiple layers including, for example, tungsten, polysilicon or metal nitride. Furthermore, a protect layer (not shown), such as a silicon nitride layer, may be formed on the capacitor top electrode 48 As shown in FIG. 8, a mask layer 50 is then formed in the memory region A and covering the capacitor top electrode 48 in the memory region A. The capacitor top electrode 48 formed in the peripheral region B is not covered by the mask layer 50. Subsequently, by using the silicon carbon nitride layer 38 as a stop layer, the capacitor top electrode 48 and the capacitor dielectric layer 48 not covered by the mask layer 50 is removed. More specifically, the silicon carbon nitride layer 38 is used as an etching stop layer again in the process of removing the capacitor top electrode 48 and the capacitor dielectric layer 48. After the capacitor top electrode 48 and the capacitor dielectric layer 46 in the peripheral region B have been removed, the capacitor bottom electrode 44, the capacitor dielectric layer 48 and the capacitor top electrode 48 in the memory region A collectively form a capacitor structure 52. Furthermore, the capacitor structure 52 and the first transistor 12 collectively form a memory cell 54, such as a memory cell used in a DRAM.

Figure 9:
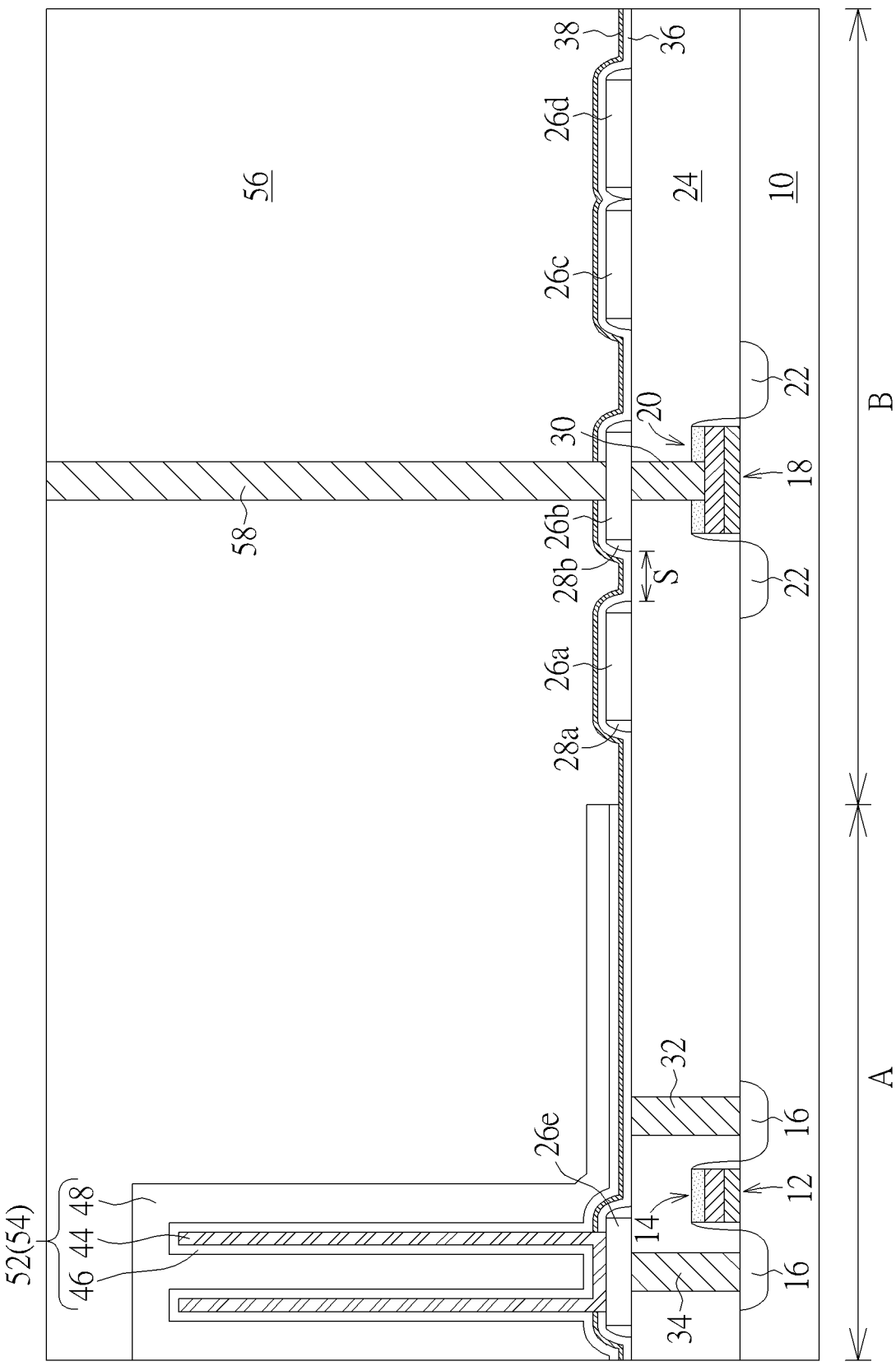

Please refer to FIG. 9. Subsequently, the mask layer 50 is removed and a dielectric layer 56 is then formed covering the memory region A and the peripheral region B. The dielectric layer 56 may include a single material layer or multiple material layers. Preferably, the dielectric layer 56 includes silicon oxide, silicon oxynitride, silicon carbon nitride or metal oxides. Furthermore, the dielectric layer 24, the dielectric layer 40 and the dielectric layer 56 disclosed in the present invention may be formed by chemical vapor deposition (CVD), physical vapor deposition (PVD), plasma-enhanced chemical vapor deposition (PECVD), spin-on or atomic layer deposition (ALD), respectively.

After forming the dielectric layer 56, a contact structure 58, such as a conductive plug, is formed in the dielectric layer 56. The contact structure 58 penetrates through the dielectric layer 56 to directly contact and be electrically connected to the second conductive line 26b.

According to another preferred embodiment, a semiconductor structure including conductive lines is disclosed. As shown in FIG. 9, the semiconductor structure includes a substrate 10 that is divided into a memory region A and a peripheral region B. The substrate 10 may be a silicon substrate, a germanium substrate, a gallium arsenide substrate, a silicon germanium substrate, an indium phosphide substrate, a gallium nitride substrate or a silicon carbide substrate. A first transistor 12 is disposed on the substrate 10 of the memory region A. A second transistor 18 is disposed on the substrate 10 of the peripheral region B. The first transistor 12 includes a first gate 14 and two source/drain regions 16 respectively disposed at two sides of the first gate 14. The second transistor 18 includes a second gate 20 and two source/drain regions 22 respectively disposed at two sides of the second gate 20. A dielectric layer 24 covers the first transistor 12 and the second transistor 18. A first conductive line 26a and a second conductive line 26b are disposed on the dielectric layer 24 of the peripheral region B. A silicon nitride layer 36 covers the first conductive line 26a and the second conductive line 26b. A silicon carbon nitride layer 38 covers and is in direct contact with the silicon nitride layer 36. It is noteworthy that the ratio of the thickness of the silicon carbon nitride layer 38 to the thickness of the silicon nitride layer 36 is 1.6 to 4.2. Furthermore, the first conductive line 26b is parallel with the first conductive line 26a. Two first spacers 28a are respectively disposed on two sides of the first conductive line 26a. Two second spacers 28b are respectively disposed on two sides of the second conductive line 26b. One of the first spacers 28a and one of the second spacers 28b are adjacent to each other and spaced apart from each other by a space S ranging from 130 nm to 170 nm. Furthermore, the silicon nitride layer 36 and the silicon carbon nitride layer 38 collectively fill up or entirely cover the space S. Furthermore, a fifth conductive line 26e is disposed on the dielectric layer 24 of the memory region A. A top surface of the first conductive line 26a, a top surface of the second conductive line 26b and a top surface of the fifth conductive line 26e are coplanar.

Furthermore, a capacitor structure 52 is disposed in the memory region A. The capacitor structure 52 is electrically connected to the first transistor 12 by the conductive plug 34 and the fifth conductive line 26e. The first transistor 12 and the capacitor structure 52 collectively form a memory cell, such as a memory cell used in a DRAM. Furthermore, a contact structure 58 is disposed on the second conductive line 26b in the peripheral region B. The contact structure 58 directly contacts and is electrically connected to the second conductive line 26b. The contact structure 58 may be a conductive plug.

It is one feature of the present invention that a silicon nitride layer 36 is formed by ALD to allow the silicon nitride layer 36 to completely cover the space S, which specifically ranges from 130 nm to 170 nm. A silicon carbon nitride layer 38 is then formed on the silicon nitride layer 36 by a carbon plasma treatment or a deposition process. The silicon carbon nitride layer 38 may be an etching stop layer during the subsequent process of removing a dielectric layer 40 and a mask layer 50 to protect the dielectric layer 24 under the conductive lines.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a stop layer, comprising:
   providing a substrate, wherein the substrate is divided into a memory region and a peripheral region, two conductive lines are disposed in the peripheral region, two spacers are respectively disposed on two sidewalls of each of the two conductive lines, a space between adjacent spacers ranges from 130 nm to 170 nm;
   performing an atomic layer deposition process to form a silicon nitride layer covering the two conductive lines; and
   after forming the silicon nitride layer, forming a silicon carbon nitride layer covering the silicon nitride layer.

2. The method of forming a stop layer according to claim 1, wherein the silicon carbon nitride layer is formed by performing a carbon plasma treatment to transform a portion of the silicon nitride layer into the silicon carbon nitride layer.

3. The method of forming a stop layer according to claim 1, wherein the silicon carbon nitride layer is formed by performing a deposition process.

4. The method of forming a stop layer according to claim 1, wherein the silicon nitride layer and the silicon carbon nitride layer collectively entirely cover the space.

5. The method of forming a stop layer according to claim 1, wherein a ratio of a thickness of the silicon carbon nitride layer to a thickness of the silicon nitride layer is 1.6 to 4.2.

6. The method of forming a stop layer according to claim 1, further comprising:
   after forming the silicon carbon nitride layer, forming a dielectric layer covering the memory region, the peripheral region and the silicon carbon nitride layer;
   forming a capacitor bottom electrode in the dielectric layer;
   after forming the capacitor bottom electrode, using the silicon carbon nitride layer as an etching stop layer to completely remove the dielectric layer; and
   after removing the dielectric layer, forming a capacitor dielectric layer and a capacitor top electrode to form a capacitor.

7. The method of forming a stop layer according to claim 6, wherein the memory region further comprises at least a memory cell comprising at least a first transistor and the capacitor, and the peripheral region comprises at least a second transistor.

8. The method of forming a stop layer according to claim 1, wherein the process temperature of forming the silicon carbon nitride layer is below 550° C.

* * * * *